United States Patent
Huang et al.

(10) Patent No.: US 12,032,276 B2
(45) Date of Patent: Jul. 9, 2024

(54) LIGHT EMITTING DIODE, LIGHT EMITTING DEVICE AND PROJECTOR DEVICE

(71) Applicant: LUMINUS (XIAMEN) CO., LTD., Fujian (CN)

(72) Inventors: Shao-Hua Huang, Fujian (CN); Xiaoqiang Zeng, Fujian (CN); Jianfeng Yang, Fujian (CN); Zechao Huang, Fujian (CN); Bosong Chen, Fujian (CN)

(73) Assignee: LUMINUS (XIAMEN) CO., LTD., Fujian (CN)

( * ) Notice: Subject to any disclaimer, the term of this patent is extended or adjusted under 35 U.S.C. 154(b) by 470 days.

(21) Appl. No.: 17/365,347

(22) Filed: Jul. 1, 2021

(65) Prior Publication Data
US 2022/0004089 A1    Jan. 6, 2022

(30) Foreign Application Priority Data

Jul. 3, 2020    (CN) .......................... 202010631519.5

(51) Int. Cl.
*G03B 21/20*    (2006.01)
*G02B 5/30*    (2006.01)
(Continued)

(52) U.S. Cl.
CPC ....... *G03B 21/2033* (2013.01); *G02B 5/3058* (2013.01); *G03B 21/2066* (2013.01); *H01L 33/10* (2013.01); *H01L 33/62* (2013.01)

(58) Field of Classification Search
CPC ............ G03B 21/2033; G03B 21/2066; G02B 5/3058; H01L 33/10; H01L 33/62
See application file for complete search history.

(56) References Cited

U.S. PATENT DOCUMENTS

| | | | |
|---|---|---|---|
| 9,291,758 B2 | 3/2016 | Cao et al. | |
| 2007/0284567 A1* | 12/2007 | Pokrovskiy | H01L 33/44 |
| | | | 257/E33.068 |
| 2010/0271566 A1* | 10/2010 | Liao | H01L 33/38 |
| | | | 257/98 |

FOREIGN PATENT DOCUMENTS

| | | |
|---|---|---|
| CN | 101088175 A | 12/2007 |
| CN | 101806401 A | 8/2010 |

(Continued)

OTHER PUBLICATIONS

Search Report received for Chinese Patent Application No. 202010631519.5, mailed on Sep. 15, 2021, 4 pages (2 pages of English Translation and 2 pages of Office Action).
(Continued)

*Primary Examiner* — Mary Ellen Bowman
(74) *Attorney, Agent, or Firm* — WOMBLE BOND DICKINSON (US) LLP

(57) ABSTRACT

A light emitting diode includes a semiconductor layer sequence stack, a reflective polarizing layer and a diffuse reflection structure. The semiconductor layer sequence stack includes first and second semiconductor layers, and a light emitting layer disposed therebetween. The reflective polarizing layer is disposed on the semiconductor layer sequence stack. The diffuse reflection structure is disposed on the light emitting layer opposite to the reflective polarizing layer. A light emitting device including the light emitting diode, and a projector including the light emitting device are also provided.

40 Claims, 9 Drawing Sheets

(51) Int. Cl.
  *H01L 33/10* (2010.01)
  *H01L 33/62* (2010.01)

(56) References Cited

FOREIGN PATENT DOCUMENTS

| | | |
|---|---|---|
| CN | 107544180 A | 1/2018 |
| CN | 210607312 U | 5/2020 |

OTHER PUBLICATIONS

Office Action received for Chinese Patent Application No. 202010631519.5, mailed on Apr. 28, 2021, 21 pages (13 pages of English Translation of Office Action, 1 page of Search Report and 7 pages of Original Office Action).

\* cited by examiner

LIGHT EMITTING DIODE, LIGHT EMITTING DEVICE AND PROJECTOR DEVICE

CROSS-REFERENCE TO RELATED APPLICATION

This application claims priority of Chinese Invention Patent Application No. 202010631519.5, filed on Jul. 3, 2020.

FIELD

The present disclosure relates to a light emitting diode, a light emitting device and a projector device.

BACKGROUND

Liquid crystal display (LCD) is one of the mainstream display methods and has been applied in various applications. In one example, a liquid crystal display (LCD) uses light emitting diode (LED) backlights, and is widely used in cell phones, televisions, notebooks and other apparatus. In another example, transmissive projection utilizes three LCD panels, and reflective projection adopts liquid crystal on silicon (LCOS) technology.

In general, an image displayed by an LCD device is accomplished by a polarizer disposed adjacent to a light source and an analyzer that is disposed near an observer. The polarization directions of the polarizer and the analyzer are oriented at right angles with respect to each other with liquid crystal confined therebetween. Then, lights pass through the polarizer, twisted liquid crystal molecules contained in the liquid crystal and the analyzer to form images. The polarizer, the analyzer and the liquid crystal together form an optical switch structure. Light emitting from the light source (e.g., an LED backlight) is usually unpolarized light, most of which cannot pass through the polarizer, thereby reducing light utilization.

SUMMARY

Therefore, an object of the disclosure is to provide a light emitting diode, a light emitting device and a projector device that can alleviate at least one of the drawbacks of the prior art.

According to one aspect of the present disclosure, a light emitting diode includes a semiconductor layer sequence stack, a reflective polarizing layer and a diffuse reflection structure. The semiconductor layer sequence stack includes a first semiconductor layer, a second semiconductor layer, and a light emitting layer disposed between the first semiconductor layer and the second semiconductor layer. The reflective polarizing layer is disposed on the semiconductor layer sequence stack. The diffuse reflection structure is disposed on the light emitting layer opposite to the reflective polarizing layer.

According to another aspect of the present disclosure, a light emitting diode includes a semiconductor layer sequence stack, a reflective polarizing layer disposed on the semiconductor layer sequence stack, a specular reflection layer disposed on the semiconductor layer sequence stack opposite to the reflective polarizing layer, and a non-planar structure disposed between the reflective polarizing layer and the specular reflection layer. The semiconductor layer sequence stack includes a first semiconductor layer, a second semiconductor layer, and a light emitting layer disposed between the first and second semiconductor layers.

According to yet another aspect of the present disclosure, a light emitting device includes the aforementioned light emitting diode, a package housing sealing the light emitting diode, and a support electrically connected to the light emitting diode.

According to still yet another aspect of the present disclosure, a projector device includes the aforementioned light emitting device, a power source for providing electrical power to the light device, and a casing enclosing the light emitting device and having an opening for emitting outwardly light from the light emitting device.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1A:
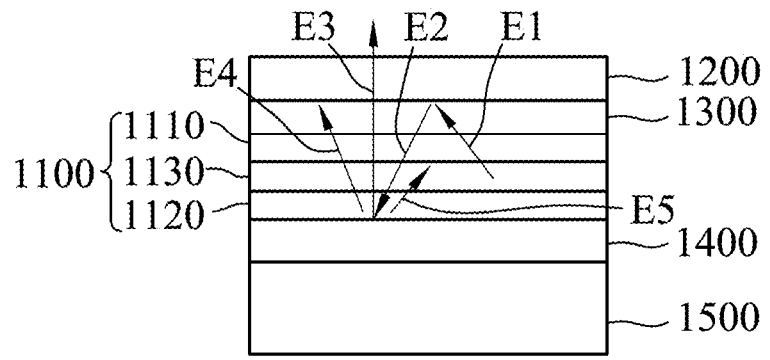
FIGS. 1A to 13 are schematic views illustrating different embodiments of a light emitting diode (LED) according to the disclosure.
Figure 1B:
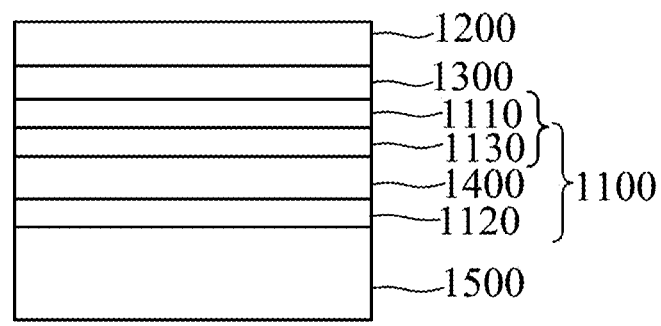

Before the disclosure is described in greater detail, it should be noted that where considered appropriate, the figures herein follow a numbering convention in which the first one digit of each of reference numerals in FIGS. 1A to 9 and the first two digits of each of reference numerals in FIGS. 10 to 23 corresponds to the figure number, and the remaining digits of each of the reference numerals identify an element or component in the figure. The remaining digits of each of the reference numbers are used throughout the figures to indicate corresponding or analogous features or components.

Figure 9:
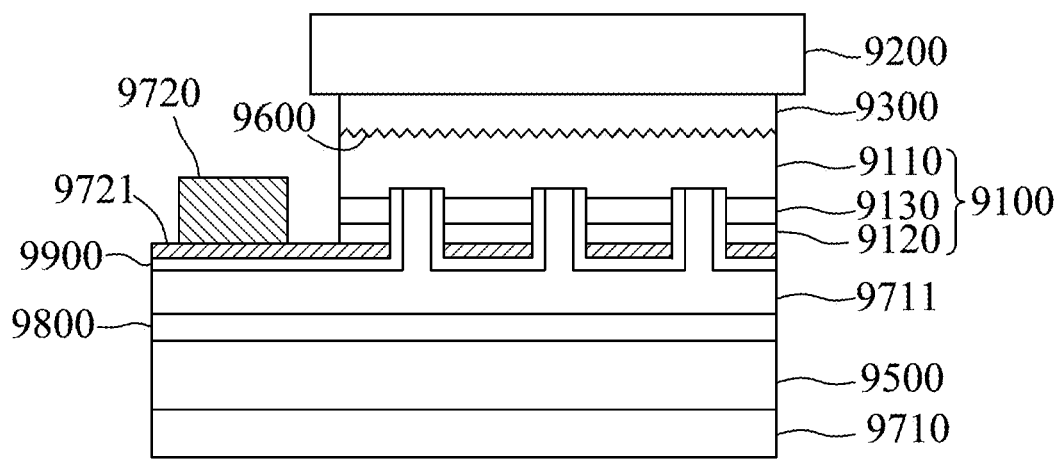

Referring to FIG. 1A, a first embodiment of a light emitting diode (LED) according to this disclosure includes a semiconductor layer sequence stack 1100, a reflective polarizing layer 1200 and a diffuse reflection structure 1400. The semiconductor layer sequence stack 1100 includes a first semiconductor layer 1110, a second semiconductor layer 1120, and a light emitting layer 1130 disposed between the first semiconductor layer 1110 and the second semiconductor layer 1120. In one embodiment, the first semiconductor layer 1110 may be an n-type semiconductor layer and the second semiconductor layer 1120 may be a p-type semiconductor layer, and vice versa. The LED further includes a first electrically connecting layer electrically connected to the first semiconductor layer 1110, and a second electrically connecting layer electrically connected to the second semiconductor layer 1120. The configurations of the first and second electrically connecting layers are shown in FIG. 9, and are indicated by numerals 9711 and 9721, respectively. The first and second electrically connecting layers may be made of a metal or transparent electrically conductive material.

The reflective polarizing layer 1200 is disposed on the semiconductor layer sequence stack 1100, in particular, on a light exit surface of the semiconductor layer sequence stack 1100, for passing lights propagating in a predetermined direction and reflecting lights propagating in a direction other than the predetermined direction, thereby generating linearly polarized lights. The light exit surface is defined as a surface through which majority of light is outputted. The light exit surface may be different in different products. In this embodiment, the light exit surface is defined as a surface through which greater than 50% of the light is outputted. In one example, the predetermined direction is a direction perpendicular to the reflective polarizing layer 1200.

The LED further includes a substrate 1500 that supports the semiconductor layer sequence stack 1100 and that is disposed on the semiconductor layer sequence stack 1100 opposite to the reflective polarizing layer 1200. The substrate 1500 may be made of, for example, copper, gold, sapphire, gallium arsenide, silicon, ceramic, glass or silicon carbide. In one example, the substrate 1500 may be a growth substrate or a bonding substrate. In another example, the substrate 1500 is a growth substrate which may be thinned during manufacturing. In certain embodiments, the substrate 1500 may be dispensed with.

In some embodiments, the reflective polarizing layer 1200 includes a reflective wire-grid structure with a periodic pattern, and may be directly formed on the light exit surface of the semiconductor layer sequence stack 1100. The reflective wire-grid structure is made of a reflective metal such as aluminum. Since the wavelength of visible light ranges from 390 nm to 770 nm, the reflective wire-grid structure is designed to have the periodic pattern having a period that ranges from 100 nm to 200 nm for blocking lights. The reflective wire-grid structure has a linewidth ranging from 50 nm to 200 nm, and a duty cycle ranging from 40% to 60%. The reflective polarizing layer 1200 further includes a light-transmissible carrier for carrying the reflective wire-grid structure. The light-transmissible carrier is adhered to the light exit surface of the semiconductor layer sequence stack 1100.

The diffuse reflection structure 1400 is disposed on the light emitting layer 1130 opposite to the reflective polarizing layer 1200. In certain examples, the diffuse reflection structure 1400 is disposed between the substrate 1500 and the semiconductor layer sequence stack 1100. In one example, the diffuse reflection structure 1400 is directly disposed on the substrate 1500. In certain embodiments, the diffuse reflection structure 1400 is disposed between the light emitting layer 1130 and one of the first semiconductor layer 1110 and the second semiconductor layer 1120 (see FIG. 1B). The diffuse reflection structure 1400 is used for scattering or reflecting lights in different directions, and has a surface formed with an irregular pattern. The diffuse reflection structure 1400 may be made of a light reflective material, and has a non-planar surface. The light reflective material may be a metal, e.g., gold, copper, titanium, aluminum, platinum, ruthenium, rhodium or silver. The non-planar surface may be formed with an irregular and non-periodic pattern, or may be a roughened surface. In certain embodiments, the diffuse reflection structure 1400 contains reflective particles. In some embodiments, the diffuse reflection structure 1400 may be made of a light-transmissible material, such as silicon oxide, silicon nitride, titanium nitride or indium tin oxide, and has a non-planar structure with reflective metal particles embedded therein. In some embodiments, the diffuse reflection structure 1400 may be formed with apertures therein for scattering lights.

Figure 1C:
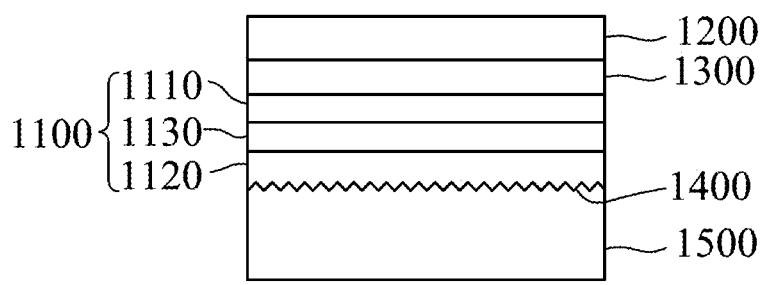

In some embodiments, the substrate 1500 is formed with the diffuse reflection structure 1400, as shown in FIG. 1C. In other words, the substrate 1500 simultaneously exhibits support and diffuse reflection properties. In an embodiment, the substrate 1500 is made of a light reflective material, and has a non-planar surface functioning as the diffuse reflection structure 1400. In an embodiment, the substrate is made of a light-transmissible material (e.g., glass or sapphire), and is embedded with reflective metal particles.

The LED further includes an intermediate layer 1300 disposed between the semiconductor layer sequence stack 1100 and the reflective polarizing layer 1200. The intermediate layer 1300 includes one of a wavelength converting layer, a light-transmissible electrically insulating layer which functions as a passivation layer for protecting the LED, and a light-transmissible electrically conductive layer for current spreading.

In this embodiment, the reflective polarizing layer 1200 only allows lights which propagate perpendicular to the reflective polarizing layer 1200 to pass therethrough and to reflect lights which propagate in other directions. The light extraction of the LED is illustrated below. As shown in FIG. 1A, a light E1 is emitted from the semiconductor layer sequence stack 1100, and is incident on the reflective polarizing layer 1200 in a non-orthogonal angle. The reflective polarizing layer 1200 reflects the light E1 to form a reflected light E2, which is then reflected by the diffuse reflection structure 1400 so as to divide into lights E3, E4 and E5. The light E3 propagating perpendicular to the reflective polarizing layer 1200 passes through the reflective polarizing layer 1200 while lights E4 and E5 propagating in non-orthogonal directions relative to the reflective polarizing layer 1200 are reflected. By repeating the aforementioned steps several times, linear polarized lights can be generated.

Figure 2:
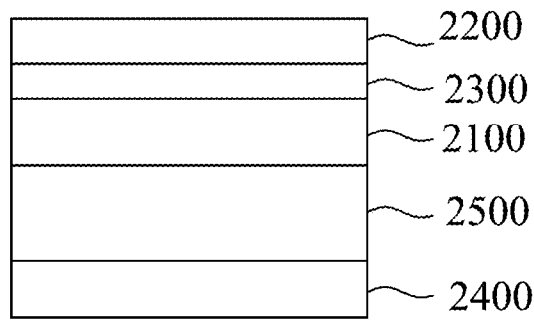

Referring to FIG. 2, a second embodiment of the LED according to this disclosure includes a semiconductor layer sequence stack 2100, a reflective polarizing layer 2200, an intermediate layer 2300, a diffuse reflection structure 2400 and a substrate 2500. The second embedment of the LED is similar to the first embodiment except that the diffuse reflection structure 2400 is disposed on the substrate 2500 opposite to the semiconductor layer sequence stack 2100, and the substrate 2500 is made of a light-transmissible material, such as glass or sapphire.

Figure 3:
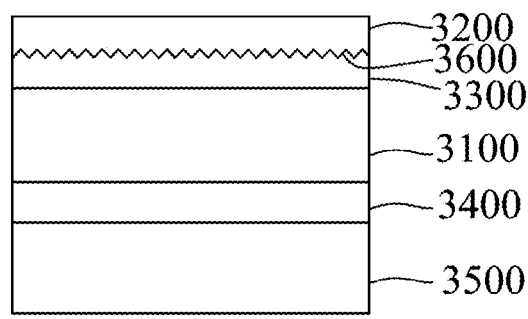

Referring to FIG. 3, a third embodiment of the LED according to this disclosure includes a semiconductor layer sequence stack 3100, a reflective polarizing layer 3200, a specular reflection layer 3400 and a non-planar structure 3600. The semiconductor layer sequence stack 3100 includes a first semiconductor layer, a second semiconductor layer, and a light emitting layer disposed between the first semiconductor layer and the second semiconductor layer. The semiconductor layer sequence stack 3100 has a thickness equal to or smaller than 10 μm. The LED further includes a first electrically connecting layer electrically connected to the first semiconductor layer, and a second electrically connecting layer electrically connected to the second semiconductor layer. The configurations of the first and second electrically connecting layers are shown in FIG. 9, and are indicated by numerals 9711 and 9721, respectively. The first and second electrically connecting layers may be made of a metal or transparent electrically conductive material.

The reflective polarizing layer 3200 is disposed on the semiconductor layer sequence stack 3100, in particular, on a light exit surface of the semiconductor layer sequence stack 3100, for passing lights propagating in a predetermined direction and reflecting lights propagating in a direction other than the predetermined direction, thereby generating linearly polarized lights. The definition of the light exit surface is the same as that illustrated in the first embodiment of the LED. In this embodiment, the LED has a light exit angle equal to or smaller than 120°. The reflective polarizing layer 3200 includes a reflective wire-grid structure with a periodic pattern having a period that ranges from 100 nm to 200 nm. The reflective wire-grid structure has a linewidth ranging from 50 nm to 200 nm. The reflective polarizing layer 3200 further includes a light-transmissible carrier for carrying the reflective wire-grid structure.

In certain embodiments, the specular reflection layer 3400 is disposed on the semiconductor layer sequence stack 3100 opposite to the reflective polarizing layer 3200. In one example, the specular reflection layer 3400 is disposed on the light emitting layer of the semiconductor layer sequence stack 3100 opposite to the reflective polarizing layer 3200. The specular reflection layer 3400 may be a reflective metal layer, a distributed Bragg reflector (DBR) structure, an omni-directional reflector (ODR) structure or combinations thereof.

The non-planar structure 3600 is disposed between the reflective polarizing layer 3200 and the specular reflection layer 3400. In certain embodiments, the non-planar structure 3600 is disposed between the semiconductor layer sequence stack 3100 and the reflective polarizing layer 3200. In certain embodiments, the non-planar structure 3600 is disposed between the light emitting layer and the reflective polarizing layer 3200. The non-planar structure 3600 may have a non-planar surface having a non-periodic irregular pattern or has a roughened surface with a roughness (Ra) ranging from 0.5 µm to 5 µm. In one example, the non-planar structure 3600 contains reflective particles.

The LED further includes an intermediate layer 3300 disposed between the reflective polarizing layer 3200 and the semiconductor layer sequence stack 3100. The intermediate layer 3300 includes one of a wavelength converting layer, a light-transmissible electrically insulating layer and a light-transmissible electrically conductive layer. In some embodiments, the intermediate layer 3300 is formed with the non-planar structure 3600, e.g., the light-transmissible electrically insulating layer with the non-planar structure 3600, the light-transmissible electrically conductive layer with the non-planar structure 3600 or the wavelength converting layer with the non-planar structure 3600. It should be noted that, although the non-planar structure 3600 is formed on a side between the reflective polarizing layer 3200 and the intermediate layer 3300 as shown in FIG. 3, the non-planar structure 3600 may be formed on a side between the intermediate layer 3300 and the semiconductor layer sequence stack 3100 or formed on both sides therebetween.

The LED further includes a substrate 3500 supporting the semiconductor layer sequence stack 3100, and the semiconductor layer sequence stack 3100 is disposed between the substrate 3500 and the reflective polarizing layer 3200. The substrate 3500 may be thinned in order to enhance the light exit function. The substrate 3500 may be made of, for example, copper, gold, sapphire, gallium arsenide, silicon, ceramic, glass or silicon carbide. In this embodiment, the specular reflection layer 3400 is disposed between the substrate 3500 and the semiconductor layer sequence 3100.

Figure 4:
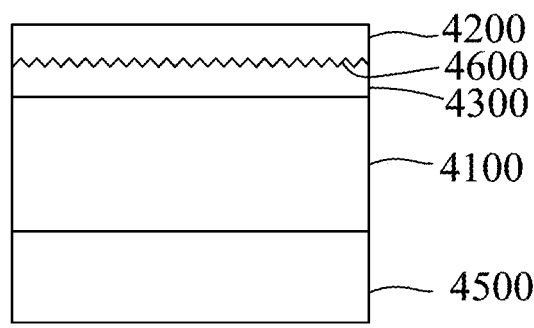

Referring to FIG. 4, a fourth embodiment of the LED according to this disclosure includes a semiconductor layer sequence stack 4100, a reflective polarizing layer 4200, an intermediate layer 4300, a non-planar structure 4600 and a substrate 4500. This embodiment of the LED is similar to the third embodiment except that the fourth embodiment of the LED does not include a specular reflection layer. In this embodiment, the substrate 4500 is directly formed on the semiconductor layer sequence stack 4100 opposite to the intermediate layer 4300. The substrate 4500 is a reflective substrate which is made of, e.g., a reflective metal or ceramic, and has a thickness sufficient for supporting the semiconductor layer sequence stack 4100.

Figure 5:
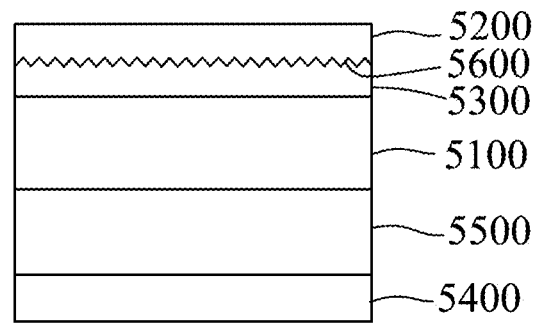

Referring to FIG. 5, a fifth embodiment of the LED according to this disclosure includes a semiconductor layer sequence stack 5100, a reflective polarizing layer 5200, an intermediate layer 5300, a specular reflection layer 5400, a non-planar structure 5600 and a substrate 5500. This embodiment of the LED is similar to the third embodiment except that the specular reflection layer 5400 is disposed on the substrate 5500 opposite to the semiconductor layer sequence stack 5100, and the substrate 5500 is made of a light-transmissible material. The substrate 5500 may be made of, for example, glass or sapphire.

Figure 6:
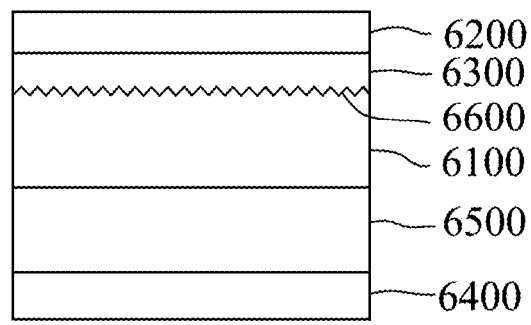

Referring to FIG. 6, a sixth embodiment of the LED according to this disclosure includes a semiconductor layer sequence stack 6100, a reflective polarizing layer 6200, an intermediate layer 6300, a specular reflection layer 6400, a non-planar structure 6600 and a substrate 6500. This embodiment of the LED is similar to the fifth embodiment except that the semiconductor layer sequence stack 6100 is formed with the non-planar structure 6600, and the non-planar structure 6600 is disposed between the semiconductor layer sequence stack 6100 and the intermediate layer 6300.

Figure 7:
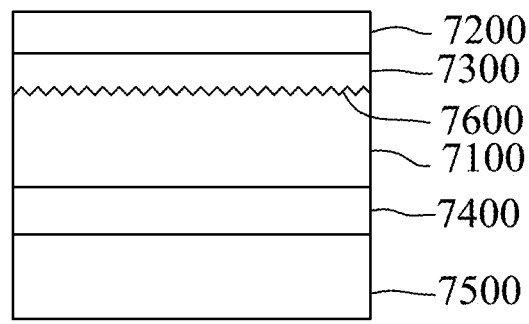

Referring to FIG. 7, a seventh embodiment of the LED according to this disclosure includes a semiconductor layer sequence stack 7100, a reflective polarizing layer 7200, an intermediate layer 7300, a specular reflection layer 7400, a non-planar structure 7600 and a substrate 7500. This embodiment of the LED is similar to the third embodiment except that the semiconductor layer sequence stack 7100 is formed with the non-planar structure 7600, and the non-planar structure 7600 is disposed between the semiconductor layer sequence stack 7100 and the intermediate layer 7300. In this embodiment, the non-planar structure 7600 has a roughened surface.

Figure 8:
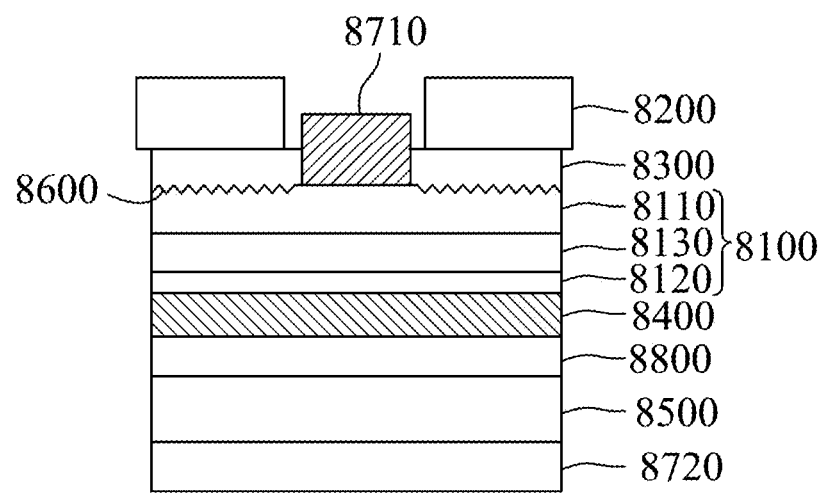

Referring to FIG. 8, an eighth embodiment of the LED according to this disclosure includes a semiconductor layer sequence stack 8100, a reflective polarizing layer 8200, an optional intermediate layer 8300, a specular reflection layer 8400, a non-planar structure 8600 and a substrate 8500. This embodiment of the LED is similar to the seventh embodiment except that the LED further includes an n-type electrode 8710 disposed on the semiconductor layer sequence stack 8100, a p-type electrode 8720 and a bonding layer 8800 that connects the substrate 8500 and the specular reflection layer 8400. The substrate 8500 is a doped silicon substrate. The p-type electrode 8720 is bonded to the substrate 8500. The bonding layer 8800 is made of an electrically conductive material.

The semiconductor layer sequence stack 8100 includes a first semiconductor layer 8110, a second semiconductor layer 8120 and a light emitting layer 8130 disposed between the first and second semiconductor layers 8110, 8120. The first semiconductor layer 8110 is an n-type semiconductor layer and formed with the non-planar structure 8600, while the second semiconductor layer 8120 is a p-type semiconductor layer. The three layers in the semiconductor layer sequence stack 8100 are made of a metal nitride, such as (Al, Ga, In)N. The non-planar structure 8600 has a roughened surface which is formed by dry or wet etching. Chemical composition and power of the plasma in dry etching, and etching solution and temperature in wet etching may be adjusted accordingly to obtain a desirable roughened surface.

The LED in this embodiment may be a GaN-based LED structure. In the GaN-based LED structure, an n-type GaN layer is formed by growing along its c-axis, and is formed as a nitrogen-polar (N-polar) surface since the anisotropic etching performance is easier to be observed on the N-polar surface rather than on a gallium-polar (Ga-polar) surface. Generally, a c-plane oriented GaN structure has planes containing gallium atoms and planes containing nitrogen atoms which are stacked together or alternately stacked on each other. That is, the Ga-polar surface is positioned opposite to the N-polar surface. In consideration of the crystal growth and device performance, it is preferable to form an N-polar surface by a laser lift-off process or to manufacture an LED structure on a c-plane oriented bulk GaN.

In this embodiment, lights are emitted from the light emitting layer 8130 and are incident on the non-planar structure 8600 to form scattered lights. However, since all the scattered lights are reflected back to the light emitting layer 8130, light extraction may be reduced, which is undesirable. Therefore, the specular reflection layer 8400 or a reflective electrode which has high reflectivity for reducing optical absorption is disposed on the second semiconductor layer 8120 in order to increase the reflected lights toward the first semiconductor layer 8110 that is formed with the non-planar structure 8600, thereby enhancing the light extraction. Experimental results have shown that the output power of an upward light propagated in the LED having the non-planar structure is higher than that in a conventional LED having a planar structure.

With the combination of the reflective polarizing layer 8200, the specular reflection layer 8400 and the non-planar structure 8600, linear polarized lights can be outputted in a maximum amount from the LED.

Referring to FIG. 9, a ninth embodiment of the LED according to this disclosure includes a semiconductor layer sequence stack 9100, a reflective polarizing layer 9200, an intermediate layer 9300, a non-planar structure 9600, a substrate 9500, an n-type electrode 9710, a p-type electrode 9720, a first electrically connecting layer 9711 and a second electrically connecting layer 9712, a bonding layer 9800, and an insulating layer 9900. The semiconductor layer sequence stack 9100 includes a first semiconductor layer 9110, a second semiconductor layer 9120 and a light emitting layer 9130 disposed between the first and second semiconductor layers 9110, 9120. The first semiconductor layer 9110 is an n-type semiconductor layer and formed with the non-planar structure 9600, while the second semiconductor layer 9120 is a p-type semiconductor layer. The n-type electrode 9710 is electrically connected to the first semiconductor layer 9110 via the first electrically connecting layer 9711. In other words, the first electrically connecting layer 9711 is electrically connected to the first semiconductor layer 9110, and the second electrically connecting layer 9721 is electrically connected to the second semiconductor layer 9120.

This embodiment of the LED are similar to that in the eighth embodiment except that the n-type electrode 9710 is electrically connected to the first semiconductor layer 9110 via the first electrically connecting layer 9711 and an electrically conductive channel formed in the insulating layer 9900. The first electrically connecting layer 9711 is electrically isolated from the second electrically connecting layer 9721 via the insulating layer 9900. The p-type electrode 9720 is electrically connected to the second semiconductor layer 9120 via the second electrically connecting layer 9721. In certain embodiments, the second electrically connecting layer 9721 may be made of a reflective metal. In certain embodiments, each of the first electrically connecting layer 9711 and the second electrically connecting layer 9721 may be made of a metal or a light-transmissible and electrically connecting material.

The substrate 9500 is an electrically conductive substrate which is bonded to the first electrically connecting layer 9711 via the bonding layer 9800. The n-type electrode 9710 is disposed on the substrate 9500 opposite to the bonding layer 9800. The non-planar structure 9600 is formed on a surface of the semiconductor layer sequence stack 9100 adjacent to the reflective polarizing layer 9200. In certain embodiments, the insulating layer 9900 includes a DBR structure.

In this embodiment, the semiconductor layer sequence stack 9100 has a thickness ranging from 5 μm to 10 μm. In certain embodiments, the thickness of the semiconductor sequence stack 9100 ranges from 10 μm to 20 μm. The LED has a light exit angle equal to or smaller than 120°.

Figure 10:
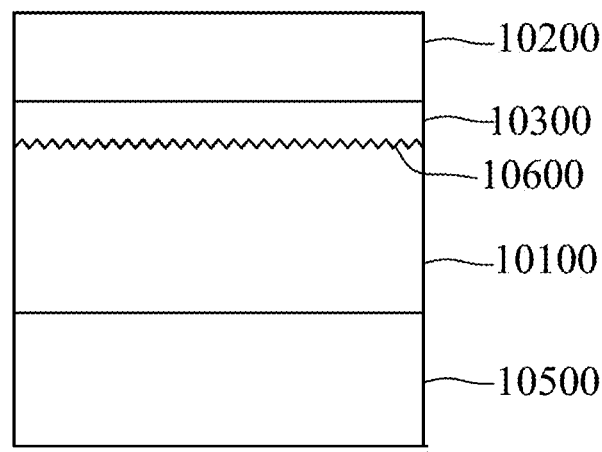

Referring to FIG. 10, a tenth embodiment of the LED according to this disclosure includes a semiconductor layer sequence stack 10100, a reflective polarizing layer 10200, an intermediate layer 10300, a non-planar structure 10600 and a substrate 10500. This embodiment of the LED is similar to the fourth embodiment except that the semiconductor layer sequence stack 10100 in the tenth embodiment of the LED is formed with the non-planar structure 10600, and the non-planar structure 10600 is disposed adjacent to the intermediate layer 10300.

Figure 11:
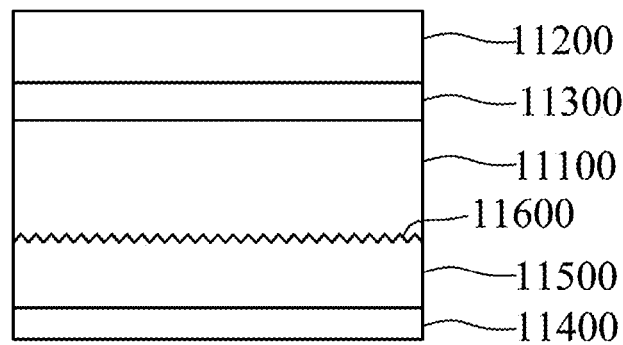

Referring to FIG. 11, a eleventh embodiment of the LED according to this disclosure includes a semiconductor layer sequence stack 11100, a reflective polarizing layer 11200, an intermediate layer 11300, a specular reflection layer 11400, a non-planar structure 11600 and a substrate 11500. This embodiment of the LED is similar to the sixth embodiment except that the non-planar structure 11600 in this embodiment is disposed between the semiconductor layer sequence stack 11100 and the specular reflection layer 11400. In particular, the non-planar structure 11600 is a non-planar surface, and is disposed between the semiconductor layer sequence stack 11100 and the substrate 11500. In certain embodiments, the non-planar structure 11600 may be integrally formed on the semiconductor layer sequence stack 11100, i.e., the semiconductor layer sequence stack 11100 is formed with the non-planar structure 11600. In certain embodiments, the non-planar structure 11600 is a non-planar surface having a pit structure.

Figure 12:
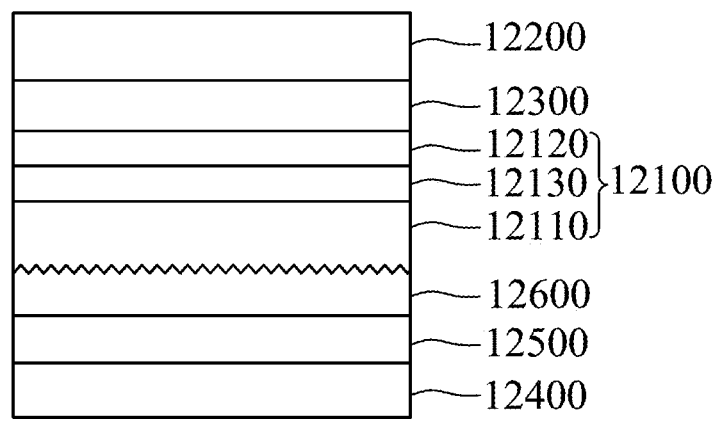

Referring to FIG. 12, a twelfth embodiment of the LED according to this disclosure includes a semiconductor layer sequence stack 12100, a reflective polarizing layer 12200, an intermediate layer 12300, a specular reflection layer 12400, a non-planar structure 12600 and a substrate 12500. The semiconductor layer sequence stack 12100 includes a first semiconductor layer 12110, a second semiconductor layer 12120 and a light emitting layer 12130 disposed between the first and second semiconductor layers 12110, 12120. The first semiconductor layer 12110 is an n-type semiconductor layer while the second semiconductor layer 12120 is a p-type semiconductor layer. This embodiment of the LED is similar to the eleventh embodiment except that the non-planar structure 12600 in this embodiment is an independent semiconductor layer. For example, the independent semiconductor layer is made of GaN and has an irregular pattern. In one example, the non-planar structure 12600 is formed on the light emitting layer 12130.

Figure 13:
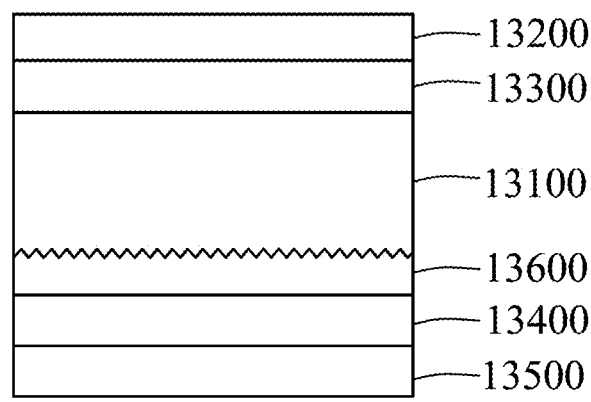

Referring to FIG. 13, a thirteenth embodiment of the LED according to this disclosure includes a semiconductor layer sequence stack 13100, a reflective polarizing layer 13200, an intermediate layer 13300, a specular reflection layer 13400, a non-planar structure 13600 and a substrate 13500. This embodiment of the LED is similar to the twelfth embodiment except that the specular reflection layer 13400 is disposed between the non-planar structure 13600 and the substrate 13500. The non-planar structure 13600 has a surface formed with an irregular pattern or a roughened surface. In one example, the non-planar structure 13600 contains particles, such as aluminum nitride, aluminum oxide or silicon oxide.

Figure 14:
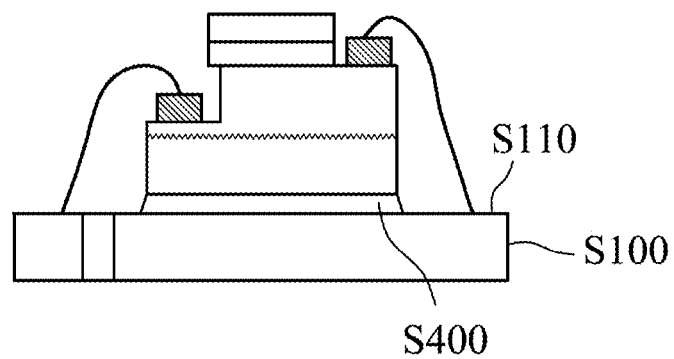
FIGS. 14 to 21 are schematic views illustrating different embodiments of a light emitting device according to the disclosure.

Referring to FIG. 14, a first embodiment of a light emitting device according to the disclosure includes a support S100 having a mounting surface S110, and an LED mounted on the mounting surface S110 and is electrically connected to the support S100. The LED is bonded to the mounting surface S110 of the support S100 via a reflective bonding layer S400. The bonding layer S400 may be made of metal of a reflective adhesive. In certain examples, the LED has a light emitting area ranging from 75% to 100% of a light emitting area of the light emitting device. The LED can be implemented as the first embodiment to the thirteenth embodiment of the LED.

Figure 15:
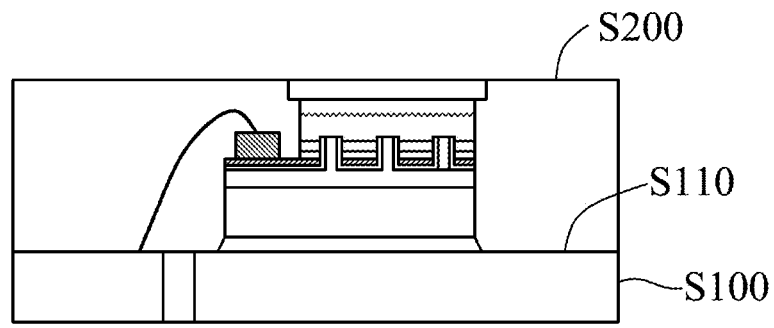

FIG. 15 shows a second embodiment of the light emitting device according to the disclosure. This embodiment is similar to the first embodiment of the light emitting device except that the LED in this embodiment is implemented in a different configuration and the LED is sealed with a package housing S200. The package housing S200 is made of a packaging material including at least one of light-transmissible molding material, reflective molding material, epoxy molding compound, opaque molding material and combinations thereof.

Figure 16:
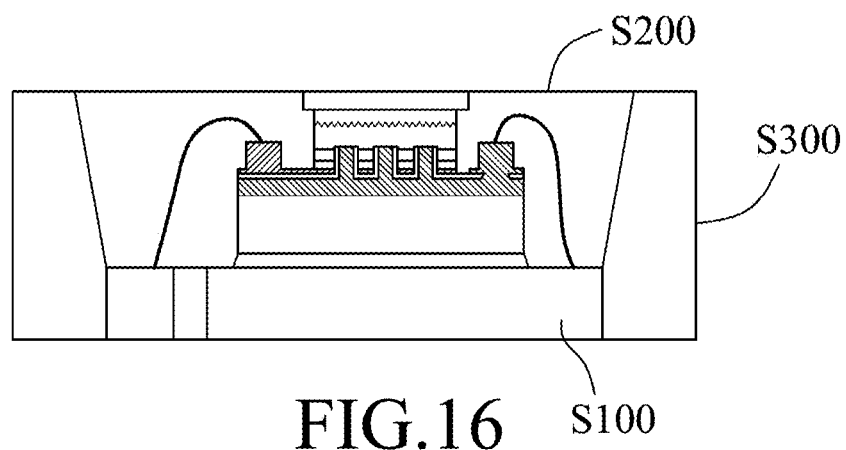

FIG. 16 shows a third embodiment of the light emitting device according to the disclosure. This embodiment is similar to the second embodiment of the light emitting device except that the LED in this embodiment is implemented in a different configuration and the LED mounted on the support S100 is sealed by the package housing S200 in a cup S300.

Figure 17:
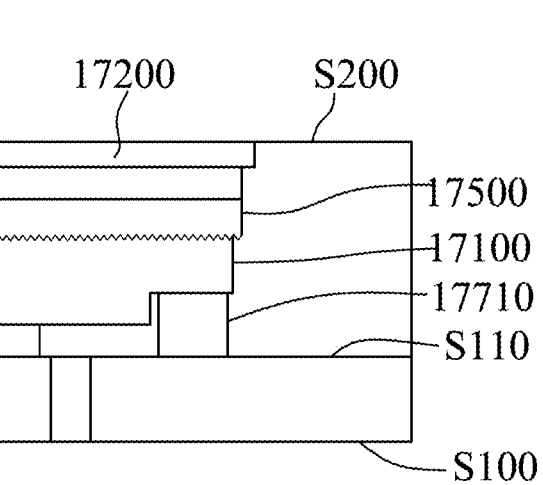

Referring to FIG. 17, a fourth embodiment of the light emitting device according to this disclosure includes a support S100, an LED mounted on a mounting surface S110 of the support S100, and a package housing S200 for packaging the LED. The LED includes a semiconductor layer sequence stack 17100, a reflective polarizing layer 17200, an intermediate layer 17300, a substrate 17500, an n-type electrode 17710 and a p-type electrode 17720. The substrate 17500 supports the semiconductor layer sequence stack 17100, and is disposed between the semiconductor layer sequence stack 17100 and the reflective polarizing layer 17200. The substrate 17500 is made of a light-transmissible material such as glass or sapphire. The substrate 17500 may be thinned. In certain embodiments, the substrate 17500 may be dispensed with. The intermediate layer 17300 is disposed between the reflective polarizing layer 17200 and the substrate 17500. The n-type electrode 17710 and the p-type electrode 17720 also function as electrically connecting layers. The LED is mounted on the support S100 with the n-type electrode 17710 and the p-type electrode 17720 facing the support S100. In this embodiment, the semiconductor layer sequence stack 17100 has a thickness ranging from 10 μm to 500 μm.

The substrate 17500 is formed with the non-planar structure 17600 on a first surface thereof facing the semiconductor layer sequence stack 17100. The non-planar structure 17600 is a non-planar surface with a pattern formed by wet etching or dry etching. By forming the semiconductor layer sequence stack 17100 on the patterned substrate 17500, the defects occurring in the semiconductor layer sequence stack 17100 may be reduced so as to increase the crystal quality.

The package housing S200 is made of a packaging material including one or more of light-transmissible molding material, reflective molding material, epoxy molding compound, opaque molding material and combinations thereof.

Figure 18:
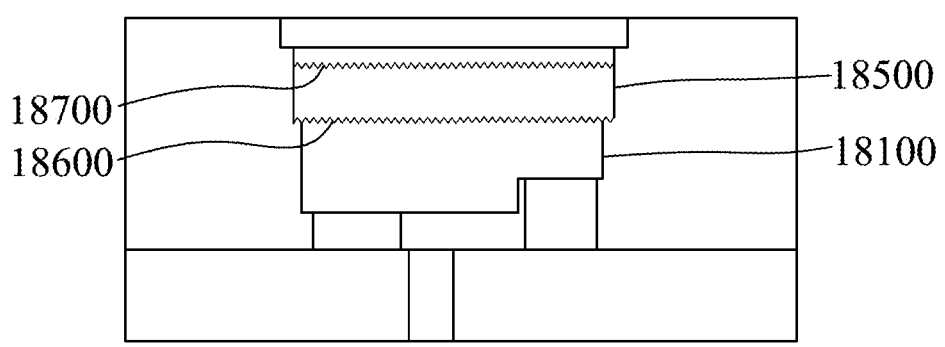

FIG. 18 shows a variation of the light emitting device of FIG. 17. The variation is similar to the light emitting device of FIG. 17 except that the substrate 18500 is further formed with a roughened structure 18700 on a second surface (i.e., light exit surface) opposite to the first surface. The roughened structure 18700 may have a pattern different from the non-planar structure 18600. With the roughened structure 18700, the light extraction of the light emitting device may be increased.

Figure 19:
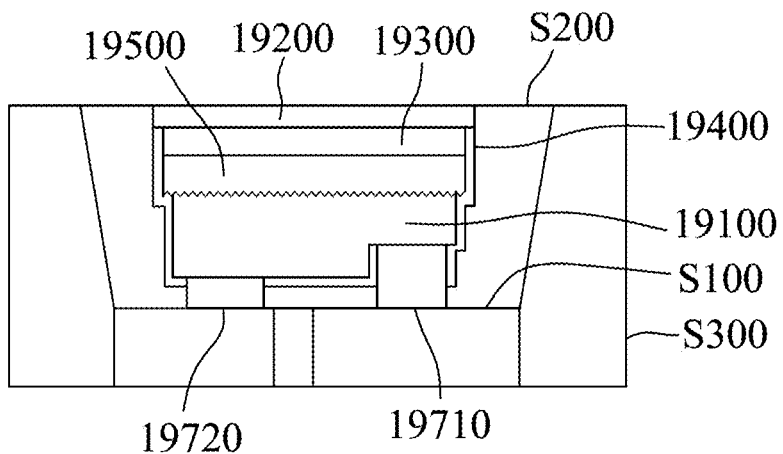

FIG. 19 shows a fifth embodiment of the light emitting device according to this disclosure. This embodiment is similar to the fourth embodiment except that a specular reflection layer 19400 extends from the reflective polarizing layer 19200 toward the support S100 to cover sides of the intermediate layer 19300, the substrate 19500, and the semiconductor layer sequence stack 19100. In some embodiments, a bottom surface of the semiconductor layer sequence stack 19100 on which the n-type electrode 19710 and the p-type electrode 19720 are disposed, is covered with the specular reflection layer 19400 at an exposed portion thereof. The specular reflection layer 19400 is a passivation reflecting layer such as a DBR reflecting stack. The specular reflection layer 19400, in combination with the n-type electrode 19710 and the p-type electrode 19720, increases the reflected lights toward the light exit surface of the substrate 19500. In some embodiments, the package housing S200 is made from white glue, and covers the exposed bottom surface of the semiconductor layer sequence stack 19100 and/or sides of the LED so as to function as a specular reflection layer. In this embodiment, the LED mounted on the support S200 is sealed by the package housing S200 in a cup S300.

Figure 20:
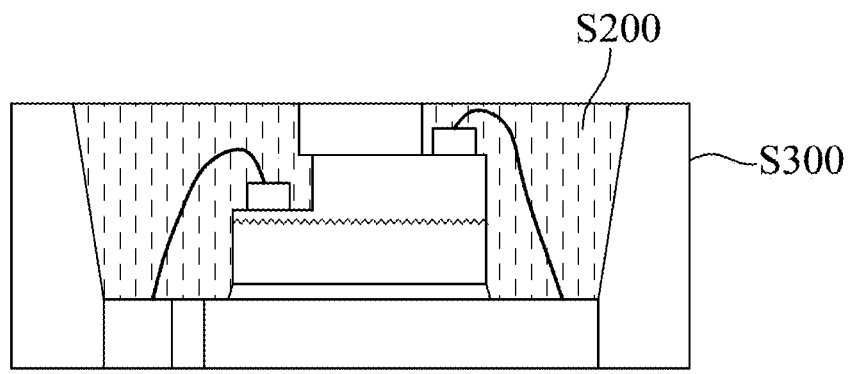

FIG. 20 shows a sixth embodiment of the light emitting device according to this disclosure. This embodiment is similar to the first embodiment except that the light emitting device of FIG. 20 is sealed by a package housing S200 in a cup S300. The detailed description regarding package housing S200 and the cup S300 may be obtained by referring to the aforesaid embodiments.

Figure 21:
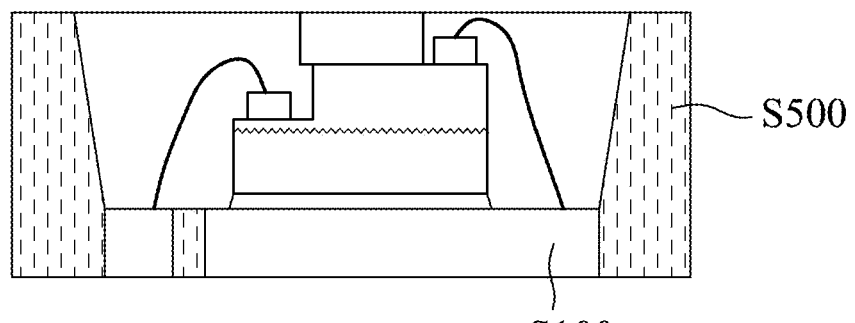

FIG. 21 shows a seventh embodiment of the light emitting device according to this disclosure. This embodiment is similar to the first embodiment except that a white wall S500 surrounds the LED and a side portion of the support S100. In one example, the white wall S500 may be disposed in a gap formed in the support S100. In one example, the package housing S200 may be dispensed with.

Figure 22:
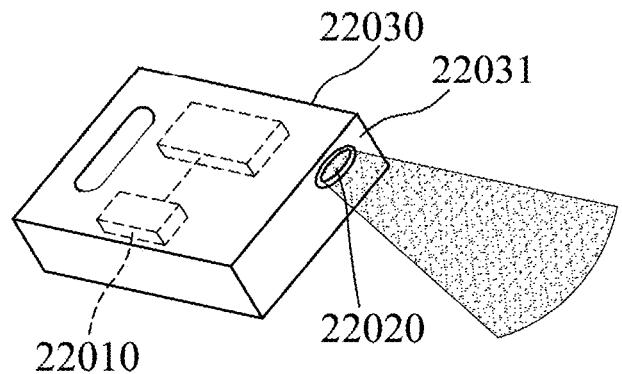
FIGS. 22 and 23 are schematic views illustrating a projector device according to the disclosure and an optical arrangement inside the projector device.
Figure 23:
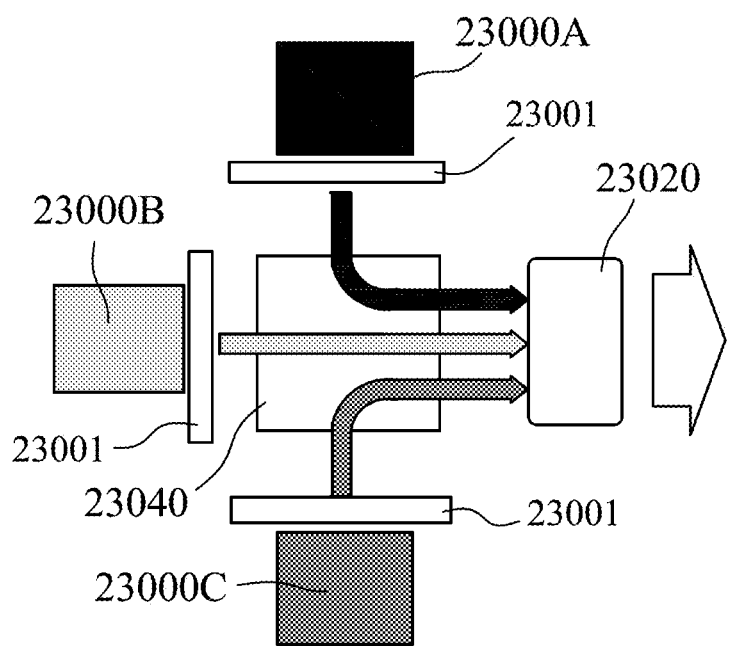

Referring to FIGS. 22 and 23, a projector device of this disclosure includes a light emitting device, a power source 22010 (e.g., battery) for providing electric power to the LED, a projecting lens 22020, and a casing 22030 enclosing the light emitting device and having an opening 22031 for emitting outwardly light from the light emitting device. The light emitting device may be implemented as the first embodiment to the seventh embodiment of the light emitting device. In this embodiment, the light emitting device includes a red-LED 23000A, a green-LED 23000B and a blue-LED 23000C. Each of the LEDs 23000A, 23000B and 23000C has its corresponding LCD 23001. With the optical path as shown in FIG. 23, light converges to the projecting lens 23020 of the projector device via a spectroscope 23040 to form a transmissive projection. The projector device according to the disclosure has a higher optoelectrical efficiency, and provides better experience for users.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode, comprising:
   a semiconductor layer sequence stack including a first semiconductor layer, a second semiconductor layer, and a light emitting layer disposed between said first semiconductor layer and said second semiconductor layer;
   a reflective polarizing layer disposed on said semiconductor layer sequence stack; and
   a diffuse reflection structure disposed on said light emitting layer opposite to said reflective polarizing layer, wherein said reflective polarizing layer includes a reflective wire-grid structure in a periodic pattern.

2. The light emitting diode of claim 1, further comprising a first electrically connecting layer electrically connected to said first semiconductor layer, and a second electrically connecting layer electrically connected to said second semiconductor layer.

3. The light emitting diode of claim 1, further comprising a substrate that supports said semiconductor layer sequence stack and that is disposed on said semiconductor layer sequence stack opposite to said reflective polarizing layer.

4. The light emitting diode of claim 3, wherein said diffuse reflection structure is disposed between said substrate and said semiconductor layer sequence stack.

5. The light emitting diode of claim 3, wherein said diffuse reflection structure is disposed between said light emitting layer and one of said first semiconductor layer and said second semiconductor layer.

6. The light emitting diode of claim 3, wherein said diffuse reflection structure is disposed on said substrate opposite to said semiconductor layer sequence stack, and wherein said substrate is made of a light-transmissible material.

7. The light emitting diode of claim 3, wherein said diffuse reflection structure is directly disposed on said substrate.

8. The light emitting diode of claim 3, wherein said diffuse reflection structure has a surface formed with an irregular pattern.

9. The light emitting diode of claim 3, wherein said diffuse reflection structure contains reflective particles.

10. The light emitting diode of claim 3, wherein said substrate is formed with said diffuse reflection structure.

11. The light emitting diode of claim 1, further comprising an intermediate layer disposed between said semiconductor layer sequence stack and said reflective polarizing layer, said intermediate layer including one of a wavelength converting layer, a light-transmissible electrically insulating layer and a light-transmissible electrically conductive layer.

12. The light emitting diode of claim 1, wherein said periodic pattern of said reflective wire-grid structure has a period ranging from 100 nm to 200 nm.

13. The light emitting diode of claim 1, wherein said reflective wire-grid structure has a linewidth ranging from 50 nm to 200 nm.

14. The light emitting diode of claim 1, wherein said reflective polarizing layer further includes a light-transmissible carrier for carrying said reflective wire-grid structure.

15. A light emitting diode, comprising:
   a semiconductor layer sequence stack including a first semiconductor layer, a second semiconductor layer, and a light emitting layer disposed between said first semiconductor layer and said second semiconductor layer;
   a reflective polarizing layer disposed on said semiconductor layer sequence stack;
   a specular reflection layer disposed on said semiconductor layer sequence stack opposite to said reflective polarizing layer; and
   a non-planar structure disposed between said reflective polarizing layer and said specular reflection layer.

16. The light emitting diode of claim 15, further comprising a first electrically connecting layer electrically connected to said first semiconductor layer, and a second electrically connecting layer electrically connected to said second semiconductor layer.

17. The light emitting diode of claim 15, wherein said non-planar structure is disposed between said semiconductor layer sequence stack and said reflective polarizing layer.

18. The light emitting diode of claim 17, wherein said non-planar structure has a roughened surface with a roughness ranging from 0.5 μm to 5 μm.

19. The light emitting diode of claim 17, wherein said non-planar structure contains reflective particles.

20. The light emitting diode of claim 17, wherein said semiconductor layer sequence stack is formed with said non-planar structure.

21. The light emitting diode of claim 20, wherein said first semiconductor layer of said semiconductor layer sequence stack is a n-type semiconductor layer and formed with said non-planar structure.

22. The light emitting diode of claim 17, further comprising a substrate supporting said semiconductor layer sequence stack, said semiconductor layer sequence stack being disposed between said substrate and said reflective polarizing layer.

23. The light emitting diode of claim 22, wherein said specular reflection layer is disposed between said substrate and said semiconductor layer sequence stack.

24. The light emitting diode of claim 17, wherein said light emitting diode has a light exit angle equal to or smaller than 120°.

25. The light emitting diode of claim 17, wherein said semiconductor layer sequence stack has a thickness equal to or smaller than 10 μm.

26. The light emitting diode of claim 17, further comprising an intermediate layer disposed between said reflective polarizing layer and said semiconductor layer sequence stack, said intermediate layer including one of a wavelength converting layer, a light-transmissible electrically insulating layer and a light-transmissible electrically conductive layer.

27. The light emitting diode of claim 26, wherein said non-planar structure is formed on said intermediate layer.

28. The light emitting diode of claim 17, wherein said reflective polarizing layer includes a reflective wire-grid structure in a periodic pattern.

29. The light emitting diode of claim 28, wherein said periodic pattern of said reflective polarizing layer has a period ranging from 100 nm to 200 nm.

30. The light emitting diode of claim 28, wherein said reflective wire-grid structure has a linewidth ranging from 50 nm to 200 nm.

31. The light emitting diode of claim 28, wherein said reflective polarizing layer further includes a light-transmissible carrier for carrying said reflective wire-grid structure.

32. The light emitting diode of claim 15, wherein said non-planar structure is disposed between said semiconductor layer sequence stack and said specular reflection layer.

33. The light emitting diode of claim 32, further comprising a substrate that supports said semiconductor layer sequence stack and that is disposed on said semiconductor layer sequence stack opposite to said reflective polarizing layer.

34. The light emitting diode of claim 33, wherein said substrate is made of a light-transmissible material, and wherein said non-planar structure is formed on said substrate opposite to said specular reflection layer.

35. The light emitting diode of claim 33, further comprising an intermediate layer that is disposed between said reflective polarizing layer and said semiconductor layer sequence stack, said intermediate layer including one of a wavelength converting layer, a light-transmissible electrically insulating layer and a light-transmissible electrically conductive layer.

36. A light emitting device, comprising:
a light emitting diode of claim 1,
a package housing sealing said light emitting diode; and
a support electrically connected to said light emitting diode.

37. A light emitting device, comprising:
a light emitting diode of claim 15,
a package housing sealing said light emitting diode; and
a support electrically connected to said light emitting diode.

38. The light emitting device of claim 37, wherein said light emitting diode has a light emitting area ranging from 75% to 100% of a light emitting area of said light emitting device.

39. A projector device, comprising:
a light emitting device of claim 36;
a power source for providing electric power to said light emitting device; and
a casing enclosing said light emitting device and having an opening for emitting outwardly light from said light emitting device.

40. A light emitting diode, comprising:
a semiconductor layer sequence stack including a first semiconductor layer, a second semiconductor layer, and a light emitting layer disposed between said first semiconductor layer and said second semiconductor layer;
a reflective polarizing layer disposed on said semiconductor layer sequence stack;
a diffuse reflection structure disposed on said light emitting layer opposite to said reflective polarizing layer; and
a substrate that supports said semiconductor layer sequence stack and that is disposed on said semiconductor layer sequence stack opposite to said reflective polarizing layer.

* * * * *